United States Patent [19]
Chang

[11] Patent Number: 5,926,417
[45] Date of Patent: Jul. 20, 1999

[54] READ METHOD FOR READING DATA FROM A HIGH-DENSITY SEMICONDUCTOR READ-ONLY MEMORY DEVICE

[75] Inventor: Kuang-Yeh Chang, Taipei, Taiwan

[73] Assignee: United Microelectronics Corp., Taiwan

[21] Appl. No.: 08/965,502

[22] Filed: Nov. 6, 1997

[30] Foreign Application Priority Data

Nov. 29, 1996 [TW] Taiwan .................................. 85114788

[51] Int. Cl.⁶ ...................................................... G11C 16/04
[52] U.S. Cl. ................................ 365/185.26; 365/185.23; 365/100
[58] Field of Search ................................ 365/185.18, 100, 365/104, 185.26, 185.23, 185.22

[56] References Cited

U.S. PATENT DOCUMENTS 5,663,903  9/1997  Guo .......................................... 365/104
5,684,733  11/1997  Wu et al. .................................. 365/100

Primary Examiner—David Nelms
Assistant Examiner—Thong Le
Attorney, Agent, or Firm—Rabin & Champagne, P.C.

[57] ABSTRACT

A read method for reading data from a ROM device is provided, which can be operated with a higher voltage to address the memory cells in the ROM device. The ROM device are formed with word and bit lines formed from metallization layers having a very low resistance so that the data current can be increased for increased performance. This read method is for use on a ROM device of the type including an array of memory cells formed at the intersections between a plurality of word lines and a plurality of bit lines. Of these memory cells, a first selected group are set to a permanently-ON state due to the forming of a contact window connecting the associated word line to the associated bit line, and a second selected group of the memory cells are set to a permanently-OFF state due to the forming of no contact window therein. The read method includes the steps of applying a high potential to the associated bit line of the currently addressed one of the memory cells while floating all of the other bit lines, and meanwhile applying a ground potential to the associated word line of the currently addressed one of the memory cells while floating all of the other word lines.

3 Claims, 3 Drawing Sheets

READ METHOD FOR READING DATA FROM A HIGH-DENSITY SEMICONDUCTOR READ-ONLY MEMORY DEVICE

BACKGROUND OF THE INVENTION

1. Field of the Invention

This invention relates to semiconductor memory devices, and more particularly, to a read method for reading data from a high-density semiconductor read-only memory (ROM) device.

2. Description of Related Art

A ROM device is a nonvolatile semiconductor memory device which is widely utilized in computer-based systems and various other intelligent electronic devices for permanent storage of routinely or frequently used program codes therein. The data stored in a ROM device can be retained permanently even after the power is turned off.

ROM devices can be constructed in various manners. One widely used type uses an array of MOSFETs to serve as the memory cells. In the mask programming process, an impurity element is doped into the channel of a selected group of these MOSFET-based memory cells that are to be set to a permanently-ON state, while the other cells that are to be set to a permanently-OFF state are undoped. The permanently-ON state represents the storage of a first binary value, for example 0; while the permanently-OFF state represents the storage of a second binary value, for example 1 as shown in FIG. 1, sections between these word lines 10 and bit lines 12 are the locations where the memory cells of the ROM device are defined, each intersection corresponding to one memory cell. In the mask programming process, the channel regions of these MOSFET-based memory cells, as designated by the reference numeral 14, are selectively doped with an impurity element to set the associated memory cells to a permanently-ON state representing the permanent storage of a first binary value, for example 0, with the undoped memory cells being set to a permanently-OFF state representing the permanent storage of a second binary value, for example 1. In the case of FIG. 1, for example, the dotted boxes those memory cells that are set to a permanently-ON state.

FIG. 2 is an equivalent circuit diagram of a group of the MOSFET-based memory cells in the conventional ROM device. As shown, the ROM device includes a plurality of parallel-spaced word lines WL1, WL2, WL3 and a plurality of parallel-spaced bit lines BL1, BL2, BL3, BL4 intercrossing the word lines WL1, WL2, WL3. The data stored in a particular memory cell in the ROM device can be read out by applying a suitable voltage (referred to as addressing voltage) to the associated word line of that memory cell.

In the case of FIG. 2, assume the memory cells 22 and 26 are set to a permanently-ON state (representing the storage of a first binary value, for example 0) while the memory cell 24 is set to a permanently-OFF state (representing the storage of a second binary value, for example 1). The memory cell 22 has its gate connected to the word line WL2 and its two source/drain regions connected respectively to the bit lines BL2 and BL3; while the memory cell 24 has its gate connected to the word line WL1 and its two source/drain regions connected respectively to the bit lines BL3 and BL4.

To read the data stored in the memory cell 22, a high potential is applied to the associated word line WL2, while a high potential is applied to the bit line BL2 and a ground potential is applied to the bit line BL3. Since the memory cell 22 is set to a permanently-ON state, its source-to-drain path (channel) is in a conductive state, allowing the high potential on the bit line BL2 to be pulled down by the ground potential on the bit line BL3, thus inducing a current to flow from the bit line BL2 through the memory cell 22 to the bit line BL3, as indicated by the arrow 25 in FIG. 2. As a result, by detecting the current in the bit line BL2 (this current is hereinafter referred to as data current), the external circuit can determine that a binary value 0 is being read out from the memory cell 22.

In the forgoing case, however, it is required that a high potential be also applied to the neighboring bit line BL1 since the neighboring memory cell 26 is also set to a permanently-ON state; otherwise, an undesired current will be also induced to flow from the bit line BL2 to the bit line BL1, resulting in erroneous data output from the bit lines.

To read the data stored in the memory cell 24, a high potential is applied to the associated word line WL1, while a high potential is applied to the bit line BL3 and a ground potential is applied to the bit line BL4. Since the memory cell 22 is set to a permanently-OFF state, its source-to-drain path is in a nonconductive state, thus allowing the high potential on the bit line BL3 to be isolated from the ground potential on the bit line BL4. As a result, by detecting the current on the bit line BL3 (in this case, no current), the external circuit can determine that a binary value 1 is being read out from the memory cell 24.

One drawback to the foregoing ROM device is that it requires the use of three lines (one word line and two bit lines) at the same time to address each of the memory cells in order to prevent the undesired current flow to the neighboring bit line associated with the neighboring memory cell that is not currently addressed.

Moreover, since the breakthrough voltage at the junction between each bit line and the channel of the associated memory cells is about 3.0 V (volt), the addressing voltage applied to the word and bit lines during the read operation should be restricted to below 3.0 V. This low addressing voltage would often make the read operation unreliable.

Still moreover, the bit lines of the conventional ROM device are formed from highly-doped diffusion region, which typically have a resistance of 100 $\Omega/\square$ (ohm per square). This resistance is still considered too high to make the data current in the bit lines large enough for reliable detection. The performance of the read operation is thus low.

SUMMARY OF THE INVENTION

It is therefore an objective of the present invention to provide a read method for reading data from a ROM device, which requires the use of only one bit line to address each of the memory cells, without the occur once of the undesired current flow to the neighboring bit line associated with the neighboring memory cell as mentioned above in the background section of this specification.

It is another an objective of the present invention to provide a read method for reading data from a ROM device, which allows no restriction on the level of the addressing voltage being applied to the word and bit lines during read operation.

It is still another objective of the present invention to provide a read method for reading data from a ROM device, whose word and bit lines have a much lower resistance compared to the prior art so that the data current can be increased for increased performance.

In accordance with the foregoing and other objectives of the present invention, a read method for reading data from a ROM device is provided. This method is for use on a ROM device of the type including an array of memory cells formed at the intersections between a plurality of word lines and a plurality of bit lines which are formed from metallization layers. Of these memory cells, a first selected group are set to a permanently-ON state due to the forming of a contact window connecting the associated word line to the associated bit line, and a second selected group of the memory cells are set to a permanently-OFF state due to the forming of no contact window therein. The read method in accordance with the invention to read data from the memory cells includes the following steps of:

applying a high potential to the associated bit line of the currently addressed one of the memory cells while floating all of the other bit lines, and meanwhile applying a ground potential to the associated word line of the currently addressed one of the memory cells while floating all of the other word lines.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
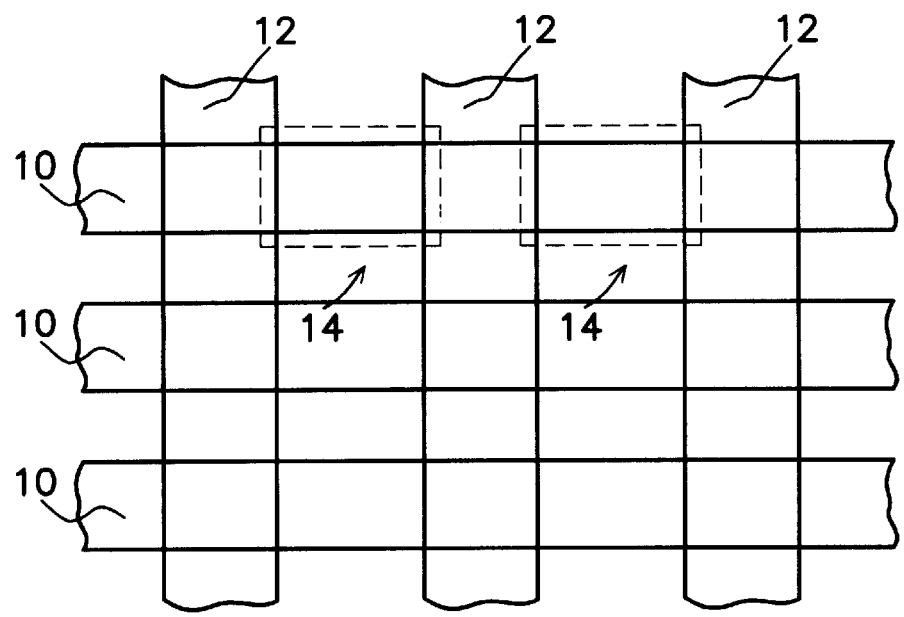
FIG. 1 is a schematic top plan view of the layout of a conventional ROM device.
Figure 2:
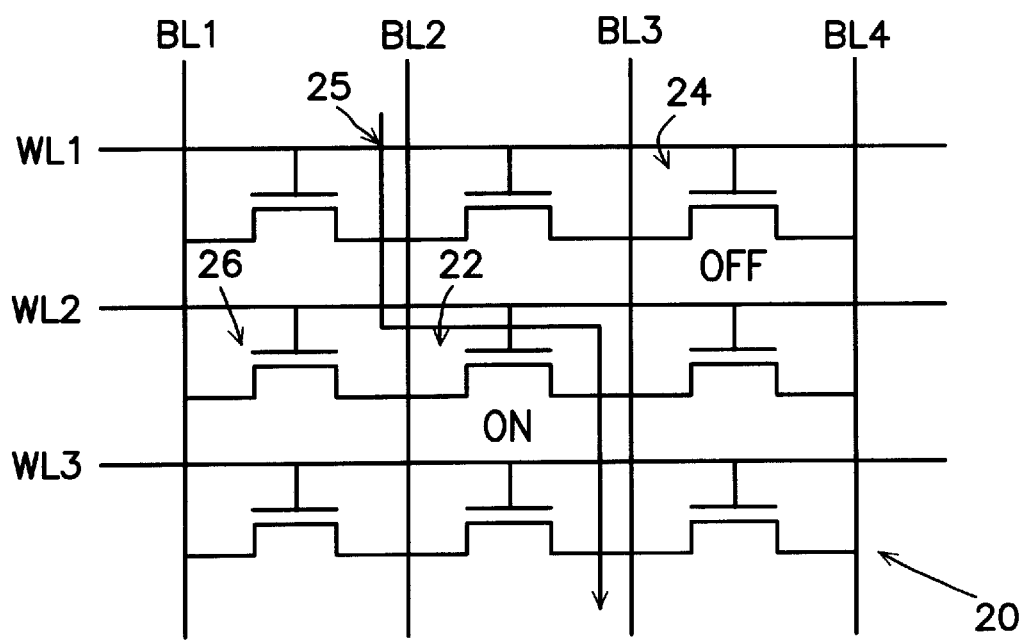
FIG. 2 is a circuit diagram of a group of MOSFET-based memory cells in the conventional ROM device.
Figure 3:
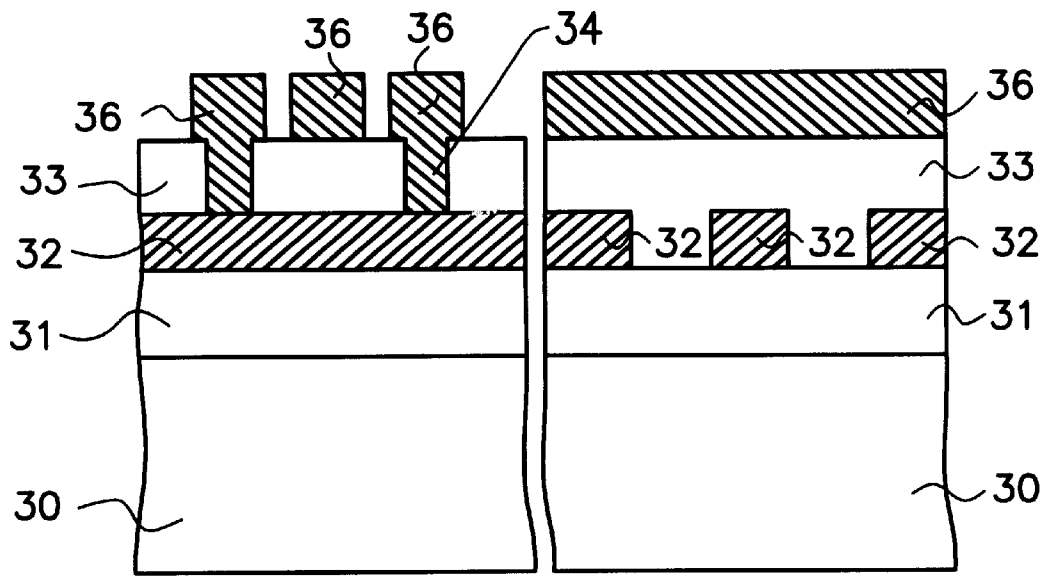
FIG. 3 is a schematic sectional diagram of a ROM device on which the read method of the invention is used to read data therefrom.

FIG. 3 is a schematic sectional diagram of a high-density ROM device on which the read method of the invention is used to read data therefrom. In FIG. 3, the left part of the diagram shows a cross section cut along the moving direction of the major carrier (channel) in the MOSFET-based memory cells, while the right part shows a cross section cut in perpendicular to the cross section of the left part. Further, FIG. 4 shows a schematic top plan view of the layout of the ROM device of FIG. 3.

As shown in FIG. 3, on a semiconductor substrate 30, such as a silicon substrate, a first insulating layer 31 is formed. Then, a plurality of parallel-spaced metallization layers serving as bit lines 32 are formed over the first insulating layer 31. A second insulating layer 33 is formed over the bit lines 32. A plurality of parallel-spaced metallization layers serving as word lines 36 are formed over the second insulating layer 33 in a direction perpendicular to the underlying bit lines 32. The intersections between these word lines 36 and bit lines 32 are the locations where the memory cells of the ROM device are defined, each intersection corresponding to one memory cell. For those memory cells that are set to a permanently-ON state, the associated locations on the word lines 36 are electrically connected to the underlying bit lines 32 via a contact window 34.

The metallization layers used to form the word and bit lines 32, 36 are preferably formed from aluminum (Al), which allows the word and bit lines 32, 36 to have a resistance of only about $10^{-3}$ $\Omega/\square$ (ohm per square). This resistance is significantly much lower than the resistance of 100 $\Omega/\square$ of the diffusion and bit lines in the prior art.

Figure 4:
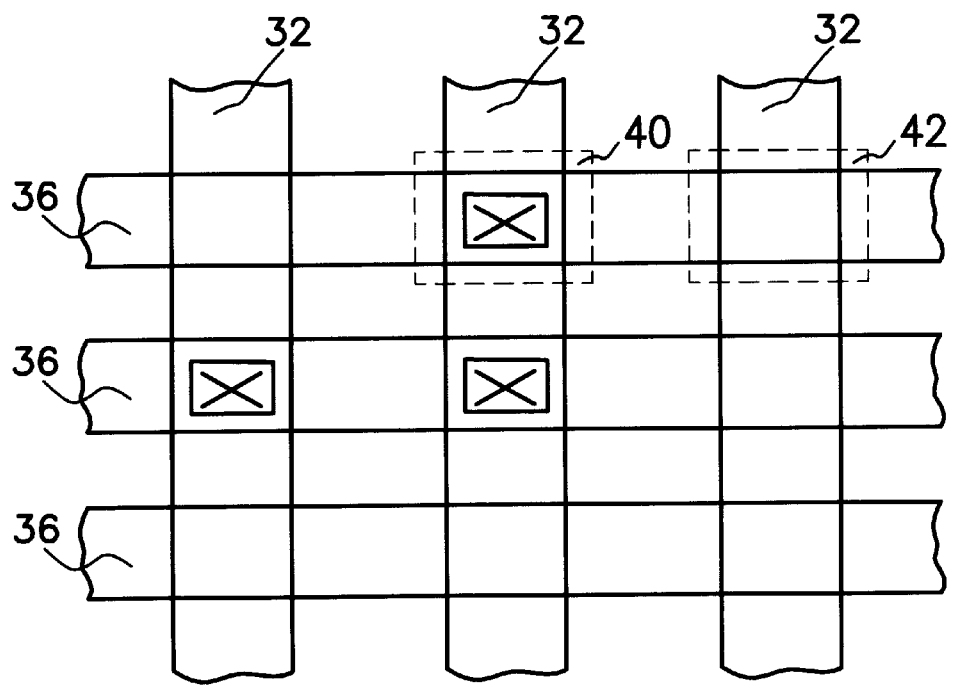
FIG. 4 is a schematic top plan view of the layout of the ROM device of FIG. 3.

Referring also to FIG. 4, the intersections between the intercrossed bit lines 32 and word lines 36 are the locations where an array of memory cells for the ROM device are defined. In the case of FIG. 4, for example, the dashed boxes designated by the reference numerals 40 and 42 are two locations where two memory cells are formed respectively. In the mask programming process, each of those memory cells that are to be set to a permanently-ON state is mask defined to form a contact window as indicated by the crossed boxes in FIG. 4 (designated by the reference numeral 34 in FIG. 3). In the case of FIG. 4, for example, the memory cell 40 is set to a permanently-ON state, while the memory cell 42 is set to a permanently-OFF state.

Through the mask programming process, binary data are programmed into the array of memory cells in the ROM device. Of these memory cells, a first selected group are set to a permanently-ON state representing the permanent storage of a first binary value, for example 0, while a second selected group are set to a permanently-OFF state representing the permanent storage of a second binary value, for example 1. Each memory cell is coupled to one word line and one bit line only. The memory cells in the same row can be accessed via the same word line, while the memory cells in the same column are connected to the same bit line.

Figure 5:
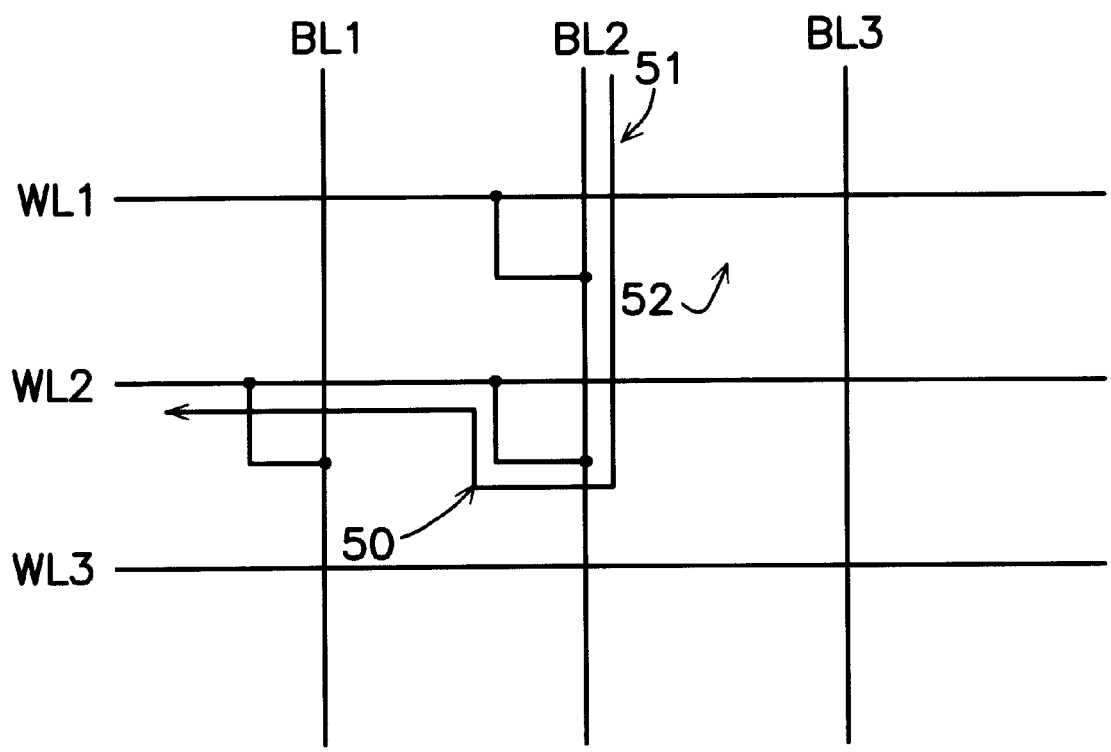
FIG. 5 is a schematic circuit diagram used to depict how the read method of the invention is u to read data from the ROM device of FIG. 3.

FIG. 5 is a schematic circuit diagram used to depict the read method in accordance with to read the data stored in the memory cells of the ROM device. In FIG. 5, those memory cells that are set to a permanently-ON state are drawn with an angled line at the intersection. The memory cells in the ROM device can be addressed by the word lines WL1, WL2, WL3 and the bit lines BL1, BL2, BL3.

To read the data stored in the memory cell 50 (which is set to a permanently-ON state), a ground potential, for example 0 V, is applied to the associated word line WL2 while floating all of the other word lines, and a high potential, for example 5 V, is applied to the associated bit line BL2 while floating all of the other bit lines. Since the memory cell 50 is set to a permanently-ON state, a current is induced to flow from the bit line BL2 through the memory cell 50 to the word line WL2, as indicated by the arrow 51 in FIG. 5. The presence of the current in the word line BL2 is then interpreted as the output of a first binary value from the currently addressed memory cell 50.

To read the data stored in the memory cell 52 (which is set to a permanently-OFF state), a similar operation is performed, in which a ground potential, for example 0 V, is applied to the associated word line WL1 while floating all of the other word lines, and a high potential, for example 5 V, is applied to the associated bit line BL3 while floating all of the other bit lines. Since the memory cell 52 is set to a permanently-OFF state, no current is induced to flow from the bit line BL3 through the memory cell 52 to the word line WL1. The condition of no current in the word line BL3 is then interpreted as the output of a second binary value from the currently selected memory cell 52.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A read method for reading from a ROM device of the type including an array of memory cells formed at the intersections between a plurality of word lines and a plurality of bit lines formed from metallization layers, with a first selected group of the memory cells being set to a permanently-ON state due to the forming of a contact window connecting the associated location on the word line to the associated bit line, and a second selected group of the memory cells being set to a permanently-OFF state due to the forming of no contact window therein; said read method comprising the steps of:

applying a high potential to the associated bit line of the currently addressed one of the memory cells while floating all of the other bit lines, and meanwhile applying a ground potential to the associated word line of the currently addressed one of the memory cells while floating all of the other word lines;

wherein said metallization layers are formed from aluminum.

2. The method of claim 1, wherein said high potential is 5 volts.

3. The method of claim 1, wherein said ground potential is 0 volt.

* * * * *